(12) United States Patent
Inoue et al.

(10) Patent No.: US 8,264,123 B2
(45) Date of Patent: Sep. 11, 2012

(54) PIEZOELECTRIC VIBRATION DEVICE SYSTEM AND ELECTRONICS APPARATUS

(75) Inventors: Yoshiaki Inoue, Aichi (JP); Jusuke Shimura, Kanagawa (JP)

(73) Assignee: Sony Corporation, Tokyo (JP)

( * ) Notice: Subject to any disclaimer, the term of this patent is extended or adjusted under 35 U.S.C. 154(b) by 88 days.

(21) Appl. No.: 12/687,351

(22) Filed: Jan. 14, 2010

(65) Prior Publication Data
US 2010/0181867 A1 Jul. 22, 2010

(30) Foreign Application Priority Data
Jan. 16, 2009 (JP) ................................. 2009-007367

(51) Int. Cl.
*H01L 41/09* (2006.01)
(52) U.S. Cl. .................................. 310/316.01; 310/317
(58) Field of Classification Search ............. 310/316.01, 310/317
See application file for complete search history.

(56) References Cited

U.S. PATENT DOCUMENTS
5,359,268 A 10/1994 Kashiyama
5,834,871 A * 11/1998 Puskas ...................... 310/316.02
2007/0184312 A1 * 8/2007 Eickhoff ......................... 429/22
2007/0247023 A1 * 10/2007 Tanimura .................. 310/316.01
2009/0167798 A1 * 7/2009 Ide et al. ......................... 347/10

FOREIGN PATENT DOCUMENTS
JP 5-184169 7/1993
JP 7-245971 9/1995

* cited by examiner

*Primary Examiner* — Derek Rosenau
(74) *Attorney, Agent, or Firm* — Oblon, Spivak, McClelland, Maier & Neustadt, L.L.P.

(57) ABSTRACT

A piezoelectric vibration device system includes a piezoelectric vibration device that performs predefined movements using the vibration of the piezoelectric element; and a control unit that controls the behavior of the piezoelectric vibration device by controlling the frequency of the piezoelectric element, where the control unit includes: a first signal generating unit that generates a fundamental frequency signal having a fundamental frequency adjacent to the mechanical resonance frequency of the piezoelectric element; a second signal generating unit that generates a variable frequency signal whose frequency periodically rises or falls; and a frequency modulator that generates a frequency modulated signal, whose frequency changes into one of three or more frequencies existing around the fundamental frequency periodically and in sequence, by executing frequency modulation using the fundamental frequency signal and the variable frequency signal, and that outputs the frequency modulated signal as a control signal for controlling the piezoelectric vibration device.

7 Claims, 12 Drawing Sheets

Sa

Sb

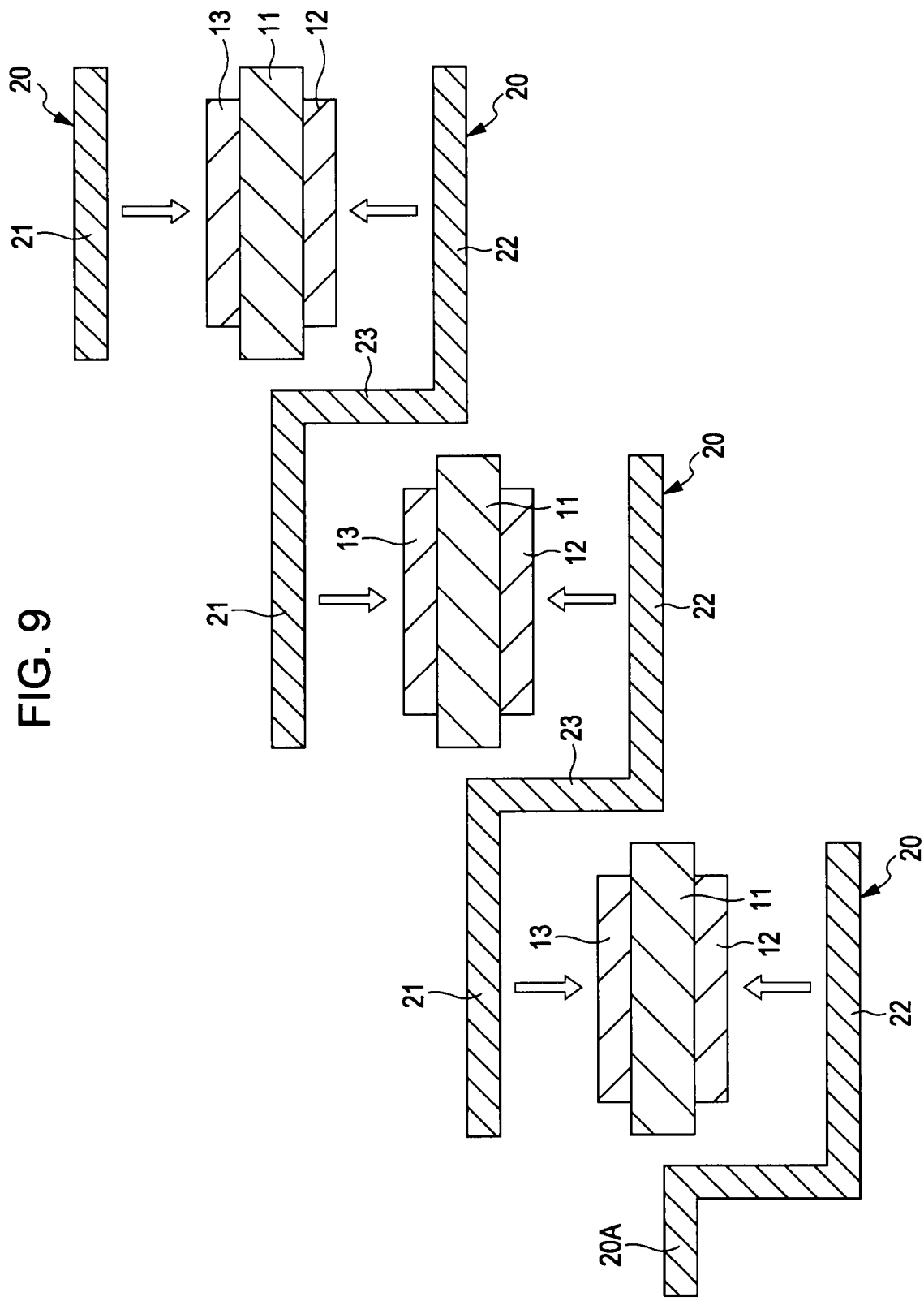

FIG. 14

| DEMULTIPLYING RATIO | FREQUENCY | Δf |
|---|---|---|
| 165 | 24.242 kHz | −146.0 Hz |
| 164 | 24.390 kHz | −147.8 Hz |
| 163 | 24.540 kHz | −149.6 Hz |
| 162 | 24.691 kHz | −151.5 Hz |
| 161 | 24.845 kHz | −153.4 Hz |
| 160 | 25.000 kHz | −155.3 Hz |
| 159 | 25.157 kHz | −157.2 Hz |
| 158 | 25.316 kHz | −159.2 Hz |
| 157 | 25.478 kHz | −161.3 Hz |
| 156 | 25.641 kHz | −163.3 Hz |
| 155 | 25.806 kHz | −165.4 Hz |

PIEZOELECTRIC VIBRATION DEVICE SYSTEM AND ELECTRONICS APPARATUS

BACKGROUND OF THE INVENTION

1. Field of the Invention

The present invention relates to a piezoelectric vibration device system including a piezoelectric vibration device that has a piezoelectric element, and an electronics apparatus including such a piezoelectric vibration device system.

2. Description of the Related Art

In the related art, fuel cells have been widely put to practical use for industrial or household electric power generators, or for power sources of artificial satellites or spaceships because they have high power generation efficiencies without exhausting harmful materials. In addition, fuel cells used for power sources of vehicles such as passenger cars, buses, and trucks have been significantly developed in recent years. Such fuel cells can be categorized into several types—such as an alkaline solution type, a phosphoric acid type, a molten carbonate type, a solid oxide type, and a direct methanol type. Among others, a direct methanol solid polymer electrolyte fuel cell (DMFC (direct methanol fuel cell) for short hereinafter) has been extensively researched and developed to be used for a small portable fuel battery because the DMFC can be highly energy-densified by using methanol as a supply source of hydrogen for fuel, and also it can be made small because it can be realized without a reformer.

In a DMFC, an MEA (membrane electrode assembly), which is a unit fuel cell composed of a solid polymer electrolyte membrane and two electrodes (gas diffusion electrodes), is used, where the membrane and the two electrodes are assembled in an all-in-one structure with the membrane disposed between the two electrodes. In this case, one of the gas diffusion electrodes is set as a fuel electrode (negative electrode), and the other is set as an oxygen electrode (positive electrode). The surface of the fuel electrode is fed with methanol as fuel, with the result that the methanol dissolves into hydrogen ions (protons) and electrons. On the other hand, the surface of the oxygen electrode (positive electrode) is fed with air as oxidizing gas. The hydrogen ions produced at the fuel electrode pass across the solid polymer electrolyte membrane, and the electrons produced at the fuel electrode are transported to the oxygen electrode through an external load or the like connected between the fuel electrode and the oxygen electrode. At the oxygen electrode, the oxygen in the air reacts with the hydrogen ions and the electrons to produce water. Owing to the above-described electrochemical reaction, the DMFC has an electromotive force between the oxygen electrode and the fuel electrode, with the result that a current flows through the external load.

In the DMFC, two types of supply methods that supply methanol to the fuel electrode are proposed—one is a liquid fuel supply type (method where liquid fuel (methanol solution) is directly supplied to the fuel electrode), and the other is a gas fuel supply type (method where vaporized fuel obtained by vaporizing liquid methanol is supplied to the fuel electrode). A scroll pump, a diffuser pump, a cascade pump, a gear pump, a screw pump, a diaphragm pump, a piston pump, a plunger pump or the like has been commonly used in the above supply methods where fuel such as methanol is supplied to the fuel electrode. However, because the above-mentioned pumps consume a significant amount of electric power and the downsizing of a DMFC with one of the above pumps installed is difficult, a piezoelectric pump (used as a fuel pump) having a piezoelectric element has also come to be used recently for supplying the fuel to the fuel electrode.

On the other hand, a rotary pump, a mechanical booster pump, or the like has been commonly used for supplying oxidizing gas (air) to the oxygen electrode. Recently, however, a piezoelectric pump (used as an air pump or a blower) having a piezoelectric element has also come to be used for supplying the oxidizing gas.

In order to control the behavior of such a piezoelectric pump having a piezoelectric element, the vibration frequency of the piezoelectric element is controlled, which is disclosed, for example, in Japanese Unexamined Patent Application Publication Nos. 05-184169 and 07-245971.

SUMMARY OF THE INVENTION

It is well-known that the mechanical resonance frequency unique to a piezoelectric element used in such a piezoelectric pump varies depending on environmental changes (such as temperature change). Therefore, in the related art, the generation of a control signal having the same frequency as the resonance frequency unique to the piezoelectric element, or the adjustment of the frequency of the control signal to the resonance frequency unique to the piezoelectric element using a resonance circuit is employed, which results in cost increases.

In addition, in the above-mentioned related art, it is necessary that the frequency of the control signal or the frequency of the resonance circuit is matched with the resonance frequency unique to the piezoelectric element with pinpoint precision even if the resonance frequency varies depending on the environmental changes, so that a sensor used for feedback control has to be installed.

Therefore, a piezoelectric vibration device system, which can be miniaturized and simplified while having the same control capability over a piezoelectric vibration device having a piezoelectric element (for example, a piezoelectric pump) as an existing vibration device system has, has been desired.

The present invention is achieved with the above-described problems borne in mind, and provides a piezoelectric vibration device system that can be miniaturized and simplified while having the same control capability over a piezoelectric vibration device with a piezoelectric element as an existing vibration device system has. In addition, the present invention provides an electronics apparatus equipped with such a piezoelectric vibration device system.

The piezoelectric vibration device system according to an embodiment of the present invention includes a piezoelectric vibration device that has a piezoelectric element and performs predefined movements with the use of the vibration of the piezoelectric element; and a control unit that controls the behavior of the piezoelectric vibration device by controlling the vibration frequency of the piezoelectric element. In addition, the control unit includes: a first signal generating unit that generates a fundamental frequency signal having a fundamental frequency adjacent to the mechanical resonance frequency of the piezoelectric element; a second signal generating unit that generates a variable frequency signal whose frequency periodically rises or falls; and a frequency modulator that generates a frequency modulated signal, whose frequency changes into one of three or more frequencies existing around the fundamental frequency periodically and in sequence, through executing frequency modulation with the use of the fundamental frequency signal and the variable frequency signal, and that outputs the frequency modulated signal as a control signal for controlling the piezoelectric vibration device.

Here, "the resonance frequency of a piezoelectric element" is a frequency at which the magnitude of the normal mode vibration of the piezoelectric element is maximum.

An electronics apparatus according to the embodiment of the present invention includes the piezoelectric vibration device system.

In the piezoelectric vibration device system and the electronics apparatus according to the embodiment of the present invention, the behavior of the piezoelectric vibration device performed with the use of the vibration of the piezoelectric element is controlled by controlling the vibration frequency of the piezoelectric element embedded in the piezoelectric vibration device. In order to generate a control signal for controlling the piezoelectric vibration device, a fundamental frequency signal having a fundamental frequency adjacent to the mechanical resonance frequency of the piezoelectric element and a variable frequency signal whose frequency periodically rises or falls are generated at the beginning. Next, a frequency modulated signal, whose frequency changes into one of three or more frequencies existing around the fundamental frequency periodically and in sequence, is generated as a control signal for controlling the piezoelectric vibration device through executing frequency modulation with the use of the fundamental frequency signal and the variable frequency signal. Therefore, a sensor for feedback control used in the related art becomes unnecessary, so that the adjustment of the frequency of the control signal to be matched with the mechanical resonance frequency of the piezoelectric element depending on the environmental changes can be omitted, with the result that the control of the frequency of the piezoelectric element comparable with the control in the related art can be realized with a simpler configuration.

In the piezoelectric vibration device system and the electronics apparatus according to the embodiment of the present invention, a frequency modulated signal is generated as the control signal for controlling the piezoelectric vibration device. The frequency of the frequency modulated signal changes into one of three or more frequencies existing around the fundamental frequency periodically and in sequence through executing frequency modulation with the use of the fundamental frequency signal and the variable frequency signal. Therefore, a piezoelectric vibration device system, which can be miniaturized and simplified while having the same control capability over a piezoelectric vibration device with a piezoelectric element as an existing vibration device system has, can be realized.

BRIEF DESCRIPTION OF THE DRAWINGS

FIG. 9 is a cross-section view for explaining the fabricating method of the electric power generation unit shown in FIG. 1;

FIG. 14 is a table showing an example of the relationship between frequency demultiplying ratios and frequencies obtained after the frequency demultiplication.

DESCRIPTION OF THE PREFERRED EMBODIMENT

An embodiment of the present invention will be described in detail hereinafter with reference to the drawings.
The description will be made about the following subjects in this order.
1. An embodiment of the present invention (an example where the present invention is applied to a fuel cell system)
2. Modifications and applications
<An Embodiment of the Present Invention>
[An Example of the Whole Configuration of a Fuel Cell System]

Figure 1:
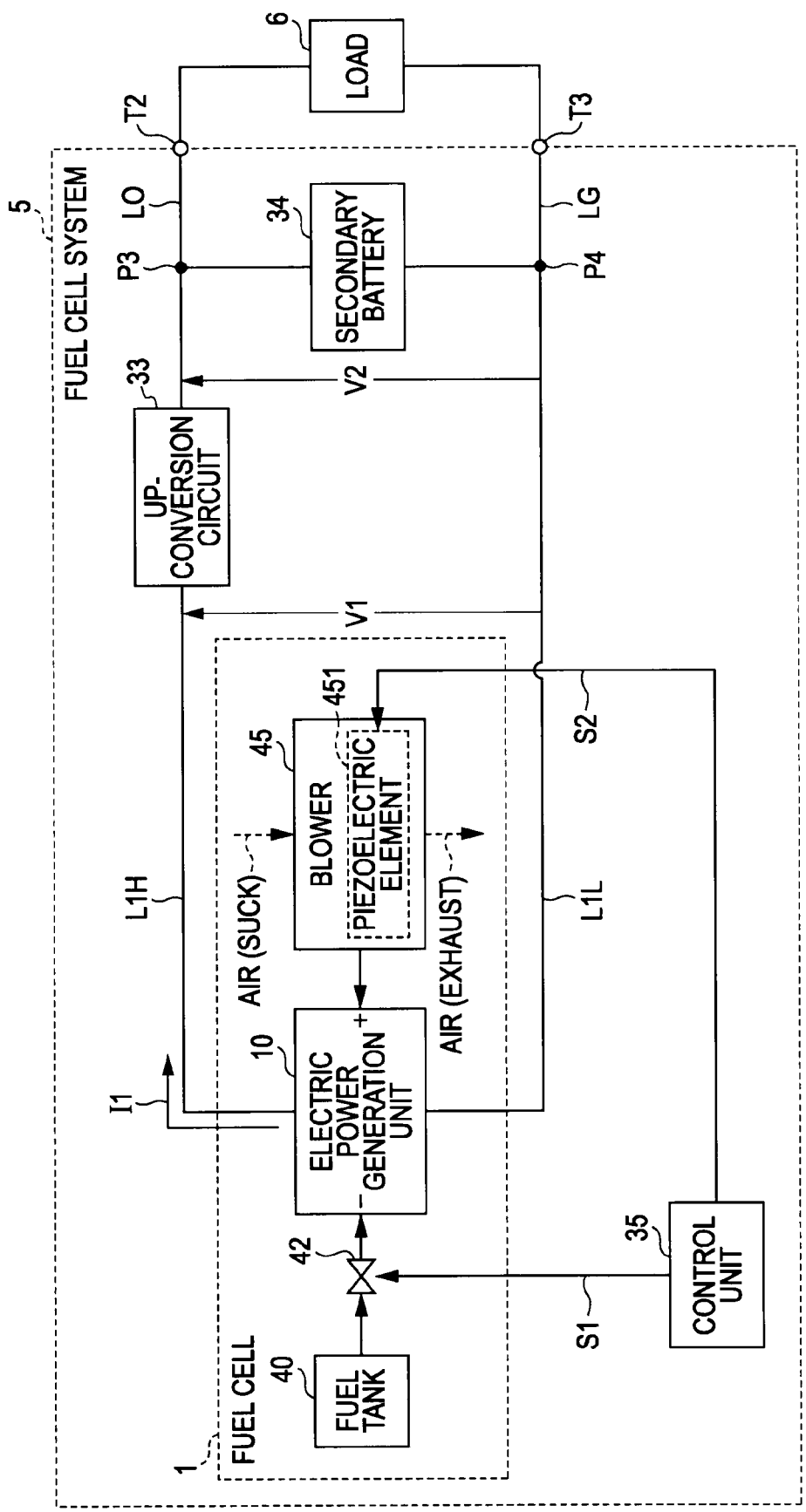
FIG. 1 is a block diagram showing the whole configuration of a piezoelectric vibration device system (fuel cell system) according to an embodiment of the present invention.

FIG. 1 is a block diagram showing the whole configuration of a piezoelectric vibration device system (fuel cell system 5) according to an embodiment of the present invention. The fuel cell system 5 supplies electric power for driving a load 6 through output terminals T2 and T3. This fuel cell system 5 includes a fuel cell 1, an up-conversion circuit 33, a secondary battery 34, and a control unit 35.

The fuel cell 1 includes an electric power generation unit 10, a fuel tank 40, a fuel pump 42, and a blower (air supply pump) 45. The detailed configuration of the fuel cell 1 will be described hereinafter.

The electric power generation unit 10 is an electric power generation unit of the direct methanol type including plural unit fuel cells, where each unit fuel cell includes a positive electrode (oxygen electrode) and a negative electrode (fuel electrode). The detailed configuration of the electric power generation unit 10 will be described hereinafter.

The fuel tank 40 houses liquid fuel (methanol or methanol solution) used for generating electric power. The detailed configuration of the fuel tank 40 will be described hereinafter.

The fuel pump 42 pumps the liquid fuel housed in the fuel tank 40, and supplies (transports) the fuel to the negative electrodes (fuel electrodes) of the electric power generation unit 10. The amount of fuel supplied by the fuel pump 42 can be adjusted as described hereinafter. This fuel pump 42 is a piezoelectric pump having a piezoelectric element 422, and performs a pumping operation with the use of the vibration of the piezoelectric element 422. The behavior (supply operation of liquid fuel) of the fuel pump 42 is controlled by the control unit 35 that is described hereinafter. The detailed configuration of the fuel pump 42 will be described hereinafter.

The blower (air supply pump) 45 sucks ambient air (oxygen) and supplies the air to the positive electrodes (oxygen electrodes) of the electric power generation unit 10. The amount of air (oxygen) supplied by the blower 45 can be adjusted as described hereinafter. This blower 45 is a piezoelectric pump having a piezoelectric element 451, and performs a pumping operation with the use of the vibration of the piezoelectric element 451. The behavior (supply operation of air by sucking and exhausting air) of the blower 45 is controlled by the control unit 35 that is described hereinafter.

The up-conversion circuit 33 is disposed between a connection line L1H and a connection point P3 on the output line LO. The up-conversion circuit 33 is a voltage conversion circuit that up-converts a voltage V1 (DC voltage) generated by the electric power generation unit 10 into a DC voltage V2. This up-conversion circuit 33 includes, for example, a DC-DC converter.

The secondary battery 34 is disposed between the connection point P3 on the output line LO and a connection point P4 on an earth line LG (connection line L1L). The secondary battery 34 stores electric energy with the use of the DC voltage V2 generated by the up-conversion circuit 33. This secondary battery 34 includes, for example, lithium-ion secondary cells.

The control unit 35 adjusts the amount of liquid fuel supplied by the fuel pump 42 and the amount of air supplied by the blower 45. That is, the control unit 35 adjusts the amount of fuel supplied by the fuel pump 42 by controlling the vibration frequency f of the piezoelectric element 422 (to be hereinafter described) housed in the fuel pump 42. The control unit 35 issues a control signal S1 to control the vibration frequency f of the piezoelectric element 422. In a similar way, the control unit 35 adjusts the amount of air supplied by the blower 45 by controlling the vibration frequency f of a piezoelectric element 451 (to be hereinafter described) housed in the blower 45. The control unit 35 issues a control signal S2 to control the vibration frequency f of the piezoelectric element 451. The control unit 35 includes, for example, a microcomputer. The detailed configuration of the control unit 35 will be described hereinafter.

[An Example of the Detailed Configuration of the Fuel Cell 1]

Figure 2:
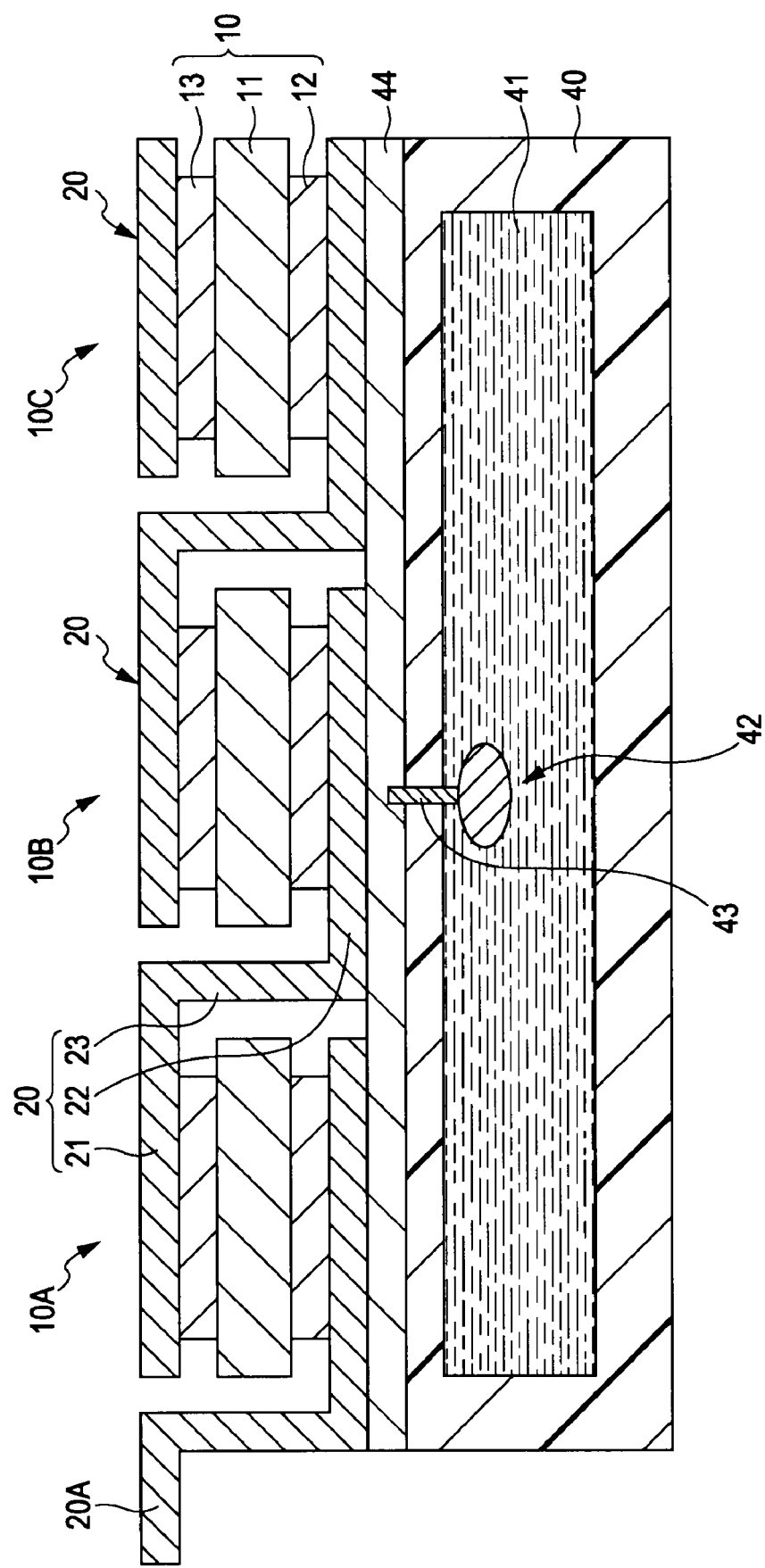
FIG. 2 is a cross-section view showing an example of a schematic configuration of the electric power generation unit shown in FIG. 1.
Figure 3:
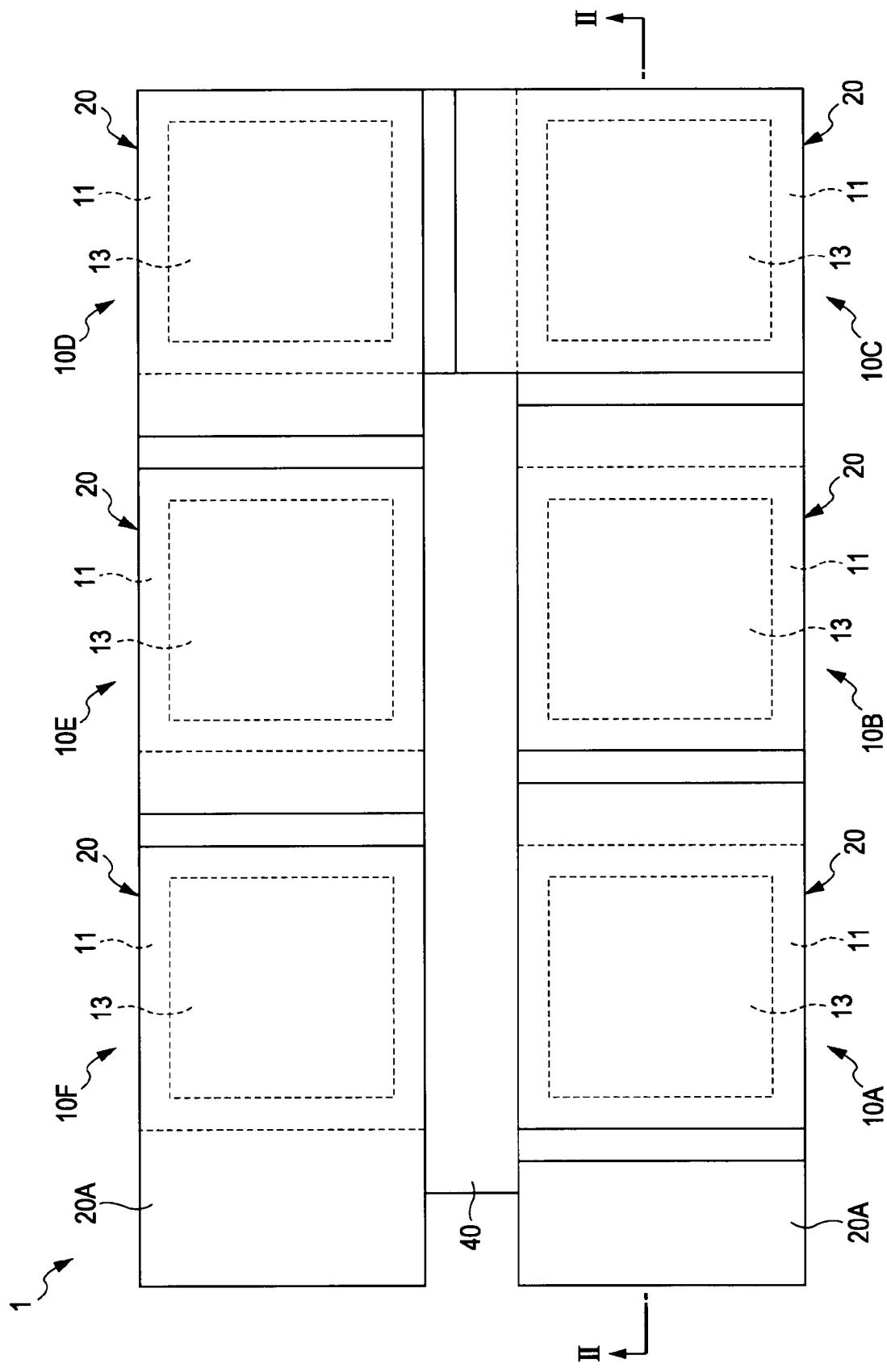
FIG. 3 is a plan view showing an example of a schematic configuration of the electric power generation unit shown in FIG. 1.

The detailed configuration of the fuel cell 1 will be described with reference to FIG. 2 to FIG. 6. FIG. 2 and FIG. 3 illustrate a configuration example of unit cells 10A to 10F and other peripheral parts of the electric power generation unit 10 housed in the fuel cell 1. FIG. 2 is a cross-sectional view taken along the line II-II of FIG. 3. The blower 45 is not shown in FIG. 2 and FIG. 3. The unit fuel cells 10A to 10F are two-dimensionally arranged, for example, in a 3-by-2 matrix, and at the same time electrically connected in series by plural connection parts 20, which results in a planar laminated structure. The unit fuel cells 10A and 10F have terminals 20A that are extension portions of the connection parts 20. In addition, there are the fuel tank 40, the fuel pump 42, a nozzle 43, and a fuel vaporizing chamber 44 under the unit fuel cells 10A to 10F.

Each of the unit fuel cells 10A to 10F has a pair of electrodes—a fuel electrode 12 (negative electrode, that is, anode electrode) and an oxygen electrode 13 (positive electrode, that is, cathode electrode)—and has an electrolyte membrane 11 between the fuel electrode and the oxygen electrode.

Each electrolyte membrane 11 is composed of, for example, a proton conductive material containing sulfonic acid groups. As a proton conductive material, a polyperfluoro-alkyl sulfonic acid proton conductive material ("Nafion (registered trademark)" manufactured by DuPont, for example), a hydrocarbonic proton conductive material such as a polyimide sulfonic acid, a fullerence proton conductive material or the like can be used.

The fuel electrodes 12 and the oxygen electrodes 13 are made of, for example, an electric charge collecting material such as carbon paper that is coated with a catalyst layer containing platinum, ruthenium or the like as a catalyst. The catalyst layer is made of, for example, a polyperfluoro-alkyl sulfonic acid proton conductive material containing catalyst supports such as carbon black for supporting catalysts. Each oxygen electrode 13 can be equipped with an air supply pump (not shown in FIG. 2 or in FIG. 3). Alternatively, an opening (not shown) can be made in the connection part 20 of each unit fuel cell so that the oxygen electrode 13 is supplied with air (oxygen) through the opening by natural ventilation.

Each of the connection parts 20 has a bend section 23 between two flat sections 21 and 22. The flat section 21 has a junction with a fuel electrode of a unit fuel cell (for example, 10A), while the flat section 22 has a junction with an oxygen electrode of the neighboring unit fuel cell (for example, 10B). Each of the connection parts 20 connects two neighboring unit fuel cells (for example, 10A and 10B) in series, and hence the connection parts 20 connect the unit fuel cells 10A to 10F in series, and at the same time have a role of electric charge collecting materials for collecting electric charge generated in the unit fuel cells 10A to 10F. The connection parts 20 are, for example, 150 μm thick, and made of copper (Cu), nickel (Ni), titan (Ti), or stainless steel (SUS). The connection parts 20 can be also plated with gold (Au), platinum (Pt) or the like. In addition, the connection parts 20 have openings (not shown) so that the fuel electrodes 12 and the oxygen electrodes 13 are supplied with fuel and air (oxygen) respectively through the openings. The connection parts 20 are made of, for example, meshes such as expanded metals or punching metals. The bend sections 23 can be made by bending in advance the connection parts 20 with reference to the thickness of the unit fuel cell, or the bend sections 23 can be formed in the fabricating process of the fuel cell 1 with the use of the flexibility of the connection parts 20 if the connection parts 20 are, for example, meshes that are less than 200 μm thick and flexible. The connection parts 20 are joined to the unit fuel cells 10A to 10F when sealants (not shown) attached to the fringe of the electrolyte membranes 11 are screwed on to the connection parts 20. The sealants are made of, for example, PPS (polyphenylene sulfide), or silicone rubber.

The fuel tank 40 includes a container that changes its volume in accordance with the amount of the liquid fuel 41 to be contained without inhaling air (for example, a vinyl bag) and a rectangular solid case that houses the container. The fuel pump 42 is located in the upper middle part of the fuel tank 40. The fuel pump 42 sucks the liquid fuel 41 from the fuel tank 40 and ejects the liquid fuel 41 through the nozzle 43.

The fuel vaporizing chamber 44 vaporizes the liquid fuel 41 supplied by the fuel pump 42 and supplies the vaporized fuel to the electric power generation unit 10, (that is, to the unit fuel cells 10A to 10F). The fuel vaporizing chamber 44 is located between the fuel pump 42 and the electric power generation unit 10. The fuel vaporizing chamber 44 includes a plate (not shown) that is composed of, for example, stainless steel, aluminum, alloyed metals, or rigid resins such as cycloolefin copolymer (COC), and a diffusion section (not shown) that is mounted on the plate and used to diffuse the fuel. The diffusion section is made of inorganic porous material such as alumina, silica, titanium oxide, or porous resin material.

The nozzle 43 is a spout that ejects the fuel supplied through the channel (not shown) of the fuel pump 42. The nozzle 43 is designed so that the fuel is ejected toward the diffusion section mounted on the plate of the fuel vaporizing chamber 44. The fuel transported to the fuel vaporizing chamber 44 is diffused, vaporized, and supplied to the electric power generation unit 10 (the unit fuel cells 10A to 10F). The caliber of the nozzle 43 typically ranges from 0.1 mm to 0.5 mm.

[An Example of the Detailed Configuration of the Fuel Pump 42]

Figure 4:
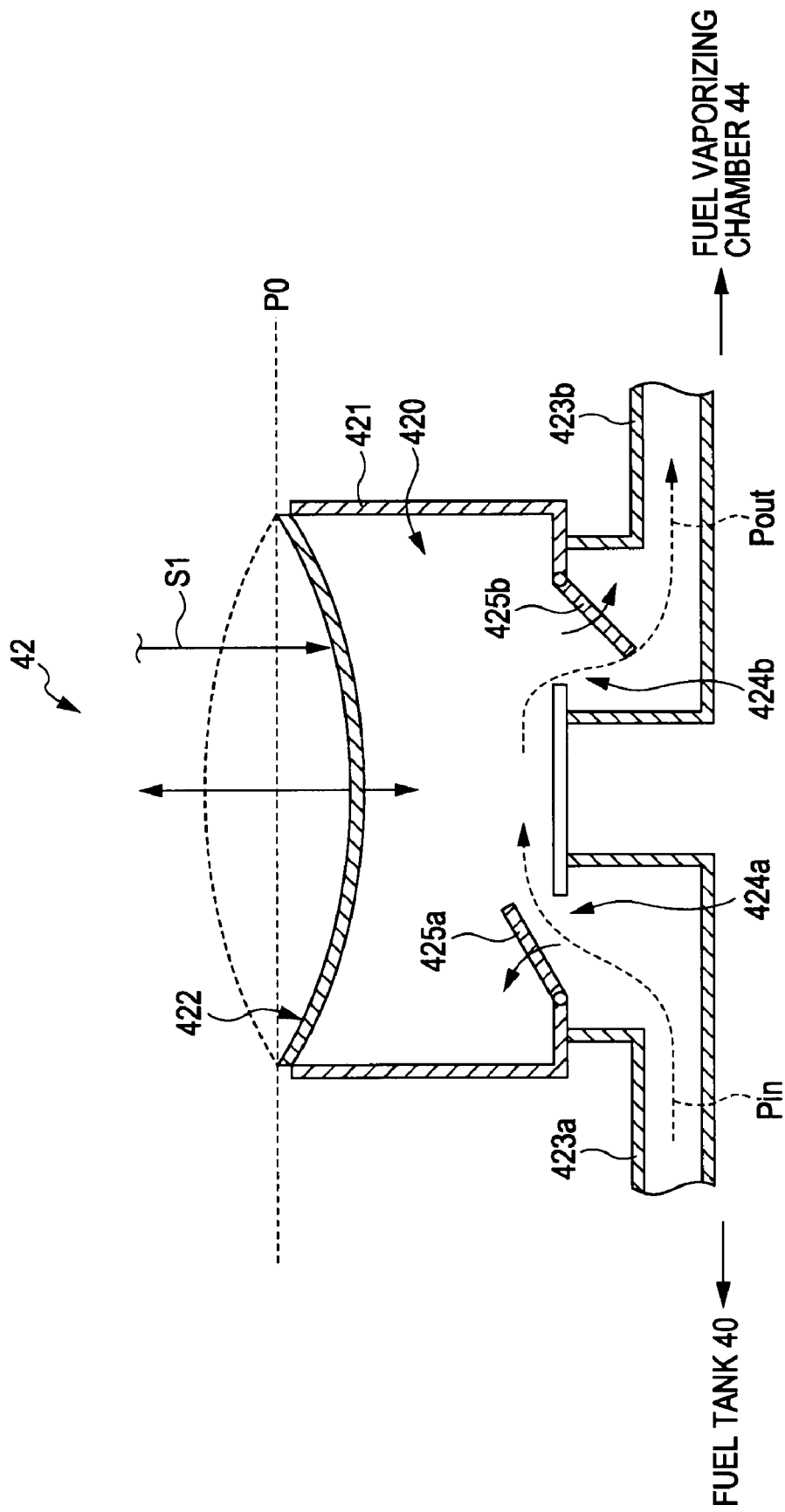
FIG. 4 is a cross-section view showing schematically a detailed configuration of a fuel pump.

The detailed configuration of the fuel pump 42 will be described with reference to FIG. 4 to FIG. 6. FIG. 4 is a cross-sectional view showing schematically a detailed configuration of a fuel pump 42.

The fuel pump 42 includes a pumping chamber 420 constituted by a vessel 421 and the piezoelectric element 422, and a pair of channels 423a and 423b that connect the fuel tank 40 and the nozzle 43, and a pair of check valves 425a and 425b. This fuel pump 42 is a kind of piezoelectric pump that transports the liquid fuel 41 from the fuel tank 40 to the fuel vaporizing chamber 44 through a route shown by arrows Pin and Pout in FIG. 4. The fuel pump 42 transports the liquid fuel 41 with the use of the flexion deformity of the piezoelectric element 422 and the switching actions of the check valves 425a and 425b, where the combination of the piezoelectric element 422 and the check valves 425a and 425b works as an actuator.

The piezoelectric element 422, which constitutes the upper plane of the pumping chamber 420, include a piezoelectric material such as lead zirconate titanate(PZT). This piezoelectric element 422 has a characteristic that it generates heat when it is deformed. Particularly, when the piezoelectric element 422 is vibrated at around its resonance frequency (eigen frequency) $f_E$ (for example, at around 45 kHz), the amount of heat the piezoelectric element 422 generates becomes large while the amount of flexion deformity also becomes very large.

The check valve 425a is installed at the suction opening 424a of the pumping chamber 420. The suction opening 424a is installed at the confluence of the pumping chamber 420 and the channel 423a at the side of the fuel tank 40. On the other hand, the check valve 425b is installed at the exhaust opening 424b of the pumping chamber 420. The exhaust opening 424b is installed at the confluence of the pumping chamber 420 and the channel 423b at the side of the fuel vaporizing chamber 44. As described above, two check valves 425a and 425b are installed at the inflow side and at the outflow side of the liquid fuel 41 respectively, which keeps the flow of the liquid fuel 41 in one direction. When the vibration frequency of the piezoelectric element 422 becomes too high, because the check valves 425a and 425b are driven at this vibration frequency, it becomes difficult for the switching actions of these check valves to keep up with this vibration frequency, with the result that the supply of the liquid fuel to the fuel vaporizing chamber 44 is stopped.

Figure 5:
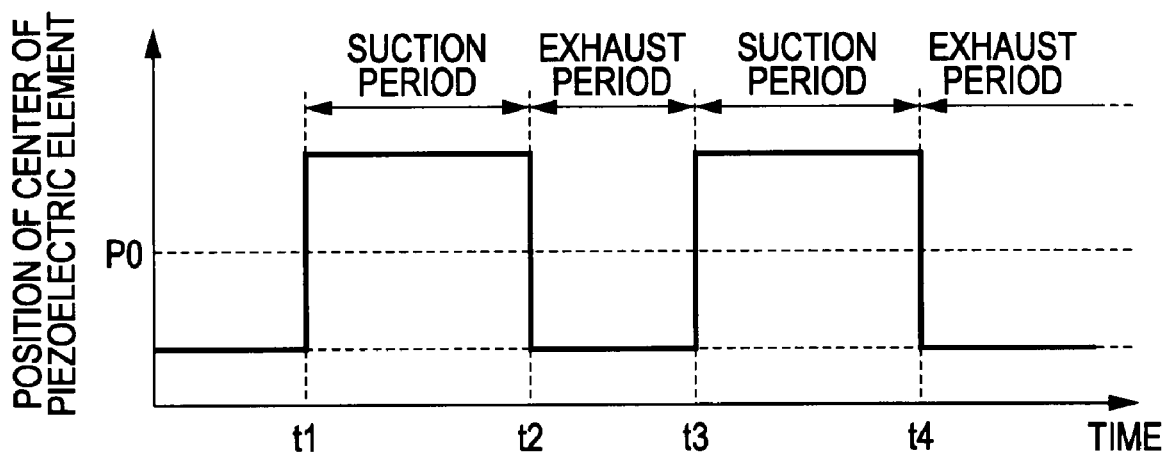
FIG. 5 is a timing chart showing the relationship between the position of the center of the piezoelectric element and the operating state of the fuel pump.
Figure 6:
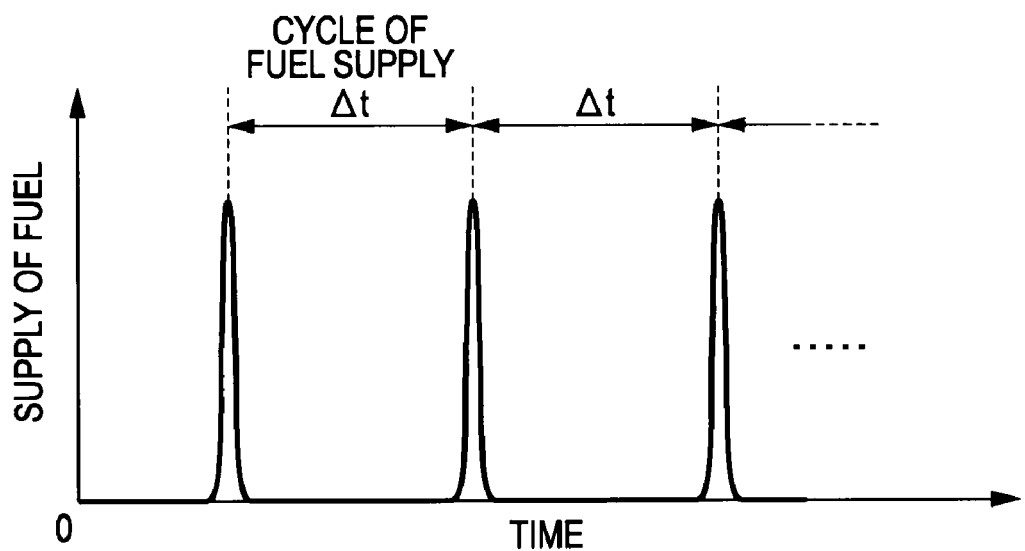
FIG. 6 is a graph showing schematically a characteristic of a gas fuel supply system.

In order to prevent the above-mentioned phenomenon from occurring, the fuel pump 42 is configured so that, for example, the suction periods of the fuel are set as the period from the time t1 to the time t2 and the period from the time t3 to the time t4, while the exhaust periods of the fuel are set as the period from the time t2 to the time t3 and the period after the time t4 in accordance with the position of the center of the piezoelectric element 422 as shown in FIG. 5. In addition, the fuel pump 42 is configured so that the supply of the liquid fuel 41 can be adjusted in accordance with the variation of the vibration frequency f of the piezoelectric element 422, the variation of the amount of the fuel supplied at one switching action of the pump 42 (refer to FIG. 6), and the variation of the cycle of the fuel supply Δt.

[An Example of the Detailed Configuration of the Control Unit 35]

Figure 7:
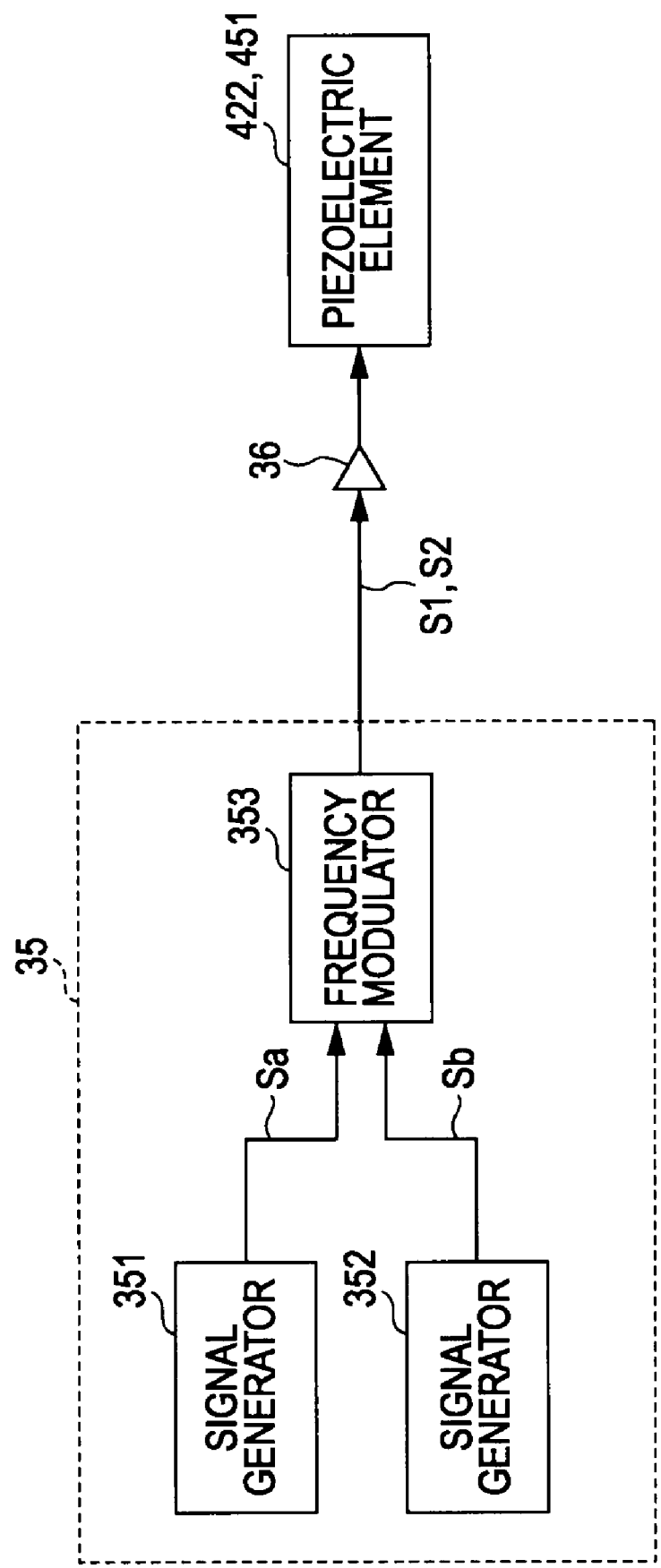
FIG. 7 is a block diagram showing a detailed configuration of the control unit shown in FIG. 1.
Figure 8A:
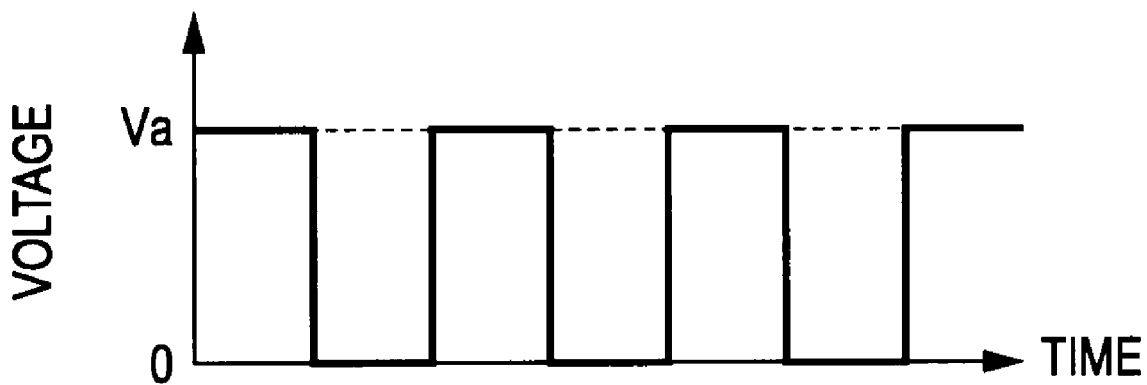
FIG. 8A and FIG. 8B are timing waveform charts showing the waveform examples of signals output from the two signal generators shown in FIG. 7.
Figure 8B:
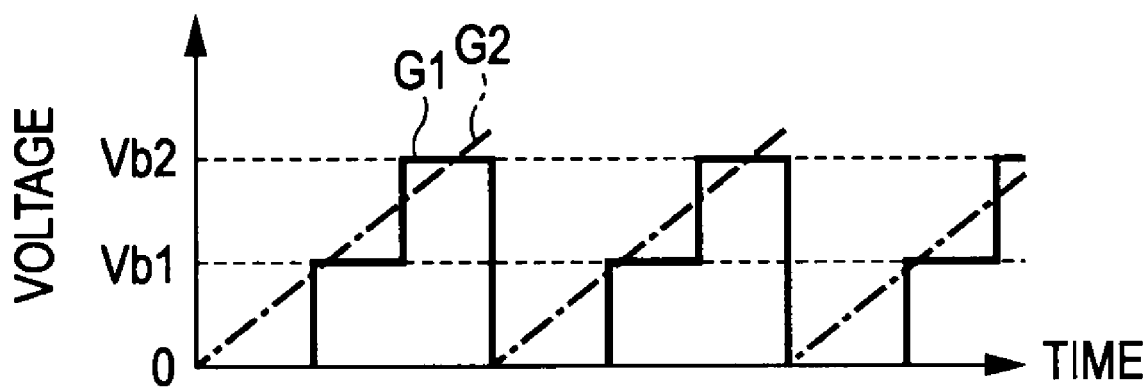

The detailed configuration of the control unit 35 will be described with reference to FIG. 7, FIG. 8A, and FIG. 8B. FIG. 7 is a block diagram showing the detailed configuration of the control unit 35 along with an amplifier 36 and the piezoelectric elements 422 and 451, where the amplifier 36 and the piezoelectric elements 422 and 451, which are targets for the control by the control unit 35, are located outside the control unit 35.

The control unit 35 includes two signal generators (function generators) 351 and 352, and a frequency modulator 353.

The signal generator 351 generates a fundamental frequency signal Sa having a fundamental frequency fa that exists around the mechanical resonance frequency fc of the piezoelectric elements 422 and 451. As an example of the fundamental frequency signal Sa, a rectangular electric signal (with its peak voltage Va) obtained by demultiplying the frequency of the main clock signal of the control unit 35 (for example, about 4 MHz) as shown in FIG. 8A can be used.

On the other hand, the signal generator 352 generates a variable frequency signal Sb having a frequency fb that varies periodically. As an example of the variable frequency signal Sb, an electric signal G1, whose timing waveform is a series of multistep waveforms (each multistep waveform has its first stage of voltage 0, its second stage of voltage Vb1, and its third stage of voltage Vb2, for example) that varies in accordance with time as shown in FIG. 8B, can be used. The preferable timing waveform of the variable frequency signal Sb is a series of multistep waveforms, where each multistep waveform has a large number of steps. In other words, the multistep waveform is an approximately triangular waveform G2 as shown in FIG. 8B. If the timing waveform of the variable frequency signal Sb is a series of approximately triangular waveforms, the number of frequencies, into which the frequency of the control signal changes periodically and in sequence, can be increased in accordance with the number of steps. The control signal will be described in detail below.

The frequency modulator 353 generates two frequency modulated signals as the control signals S1 and S2 by executing frequency modulation with the use of the fundamental frequency signal Sa output from the signal generating unit 351 and the variable frequency signal Sb output from the variable frequency modulator 352. That is, each frequency modulated signal is a frequency modulated signal whose frequency changes periodically and in sequence into one of three or more frequencies existing around the fundamental frequency fa.

As described above, the control signals S1 and S2, which are frequency modulated signals, are generated and output by the control unit 35. Then after being amplified by the amplifier 36, the control signals S1 and S2 are supplied to the piezoelectric elements 422 and 451 that are the targets for the control.

The fuel pump 42 and the blower 45 respectively correspond to concrete examples of the "piezoelectric pump" and the "piezoelectric vibration device" according to the embodiment of the present invention. In addition, the signal generator 351 corresponds to a concrete example of the "first signal generating unit", and the signal generator 352 corresponds to a concrete example of the "second signal generating unit".

[An Example of the Method of Fabricating the Fuel Cell System]

For example, the fuel cell system 5 according to the embodiment of the present invention can be fabricated in the following way.

Firstly, the electrolyte membrane 11 made of one of the above-mentioned materials is disposed between the fuel electrodes 12 and 13 made of the above-mentioned materials, and then thermocompression is applied to the assembly of the electrolyte membrane 11, the fuel electrodes 12 and 13 in order to bond them. In this way the unit fuel cells 10A to 10F are fabricated.

Figure 10:
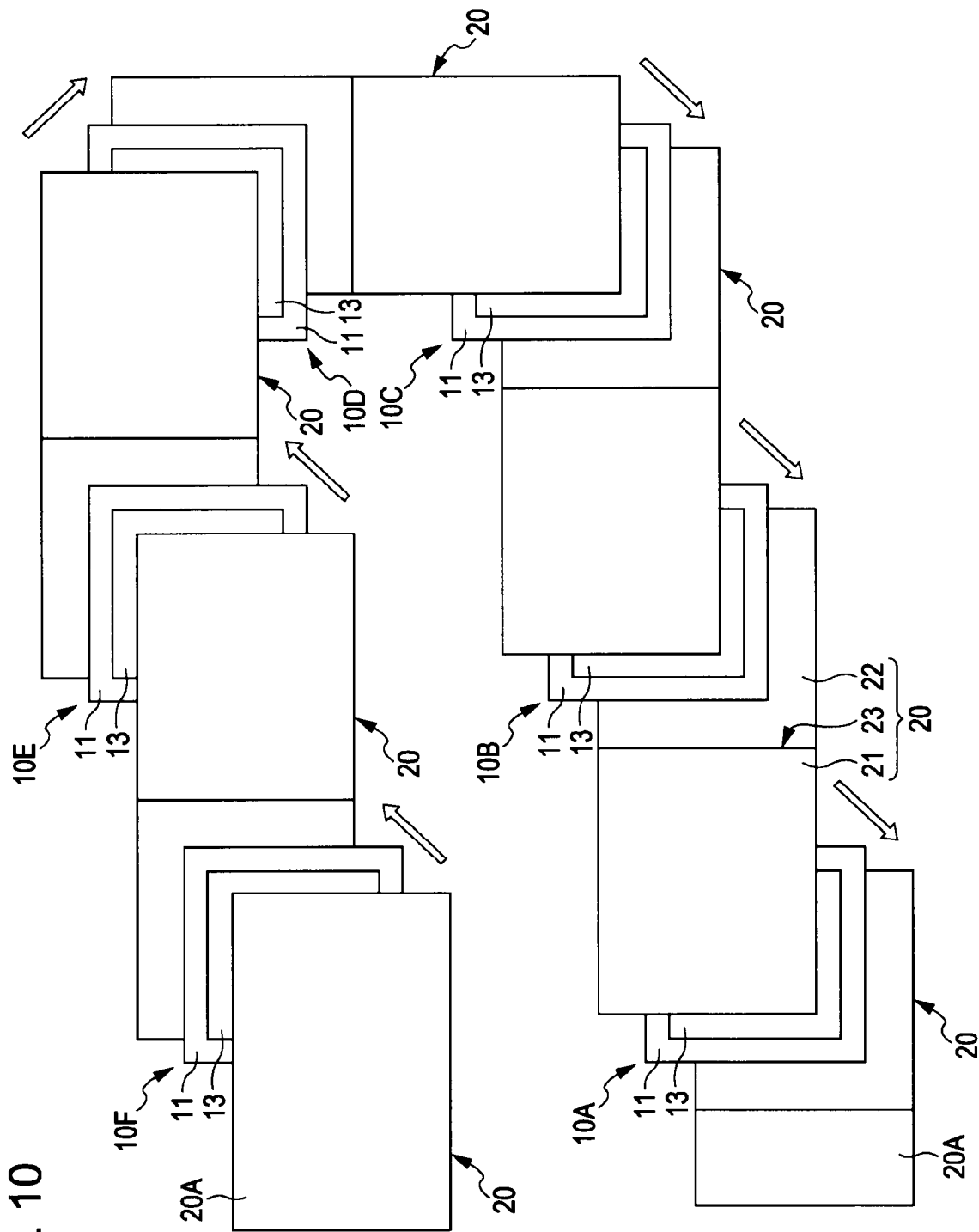
FIG. 10 is a plan view for explaining the fabricating method of the electric power generation unit shown in FIG. 1.

Next, the unit fuel cells 10A to 10F are two-dimensionally arranged in a 3-by-2 matrix, and electrically connected in series with the use of the connection parts 20 made of the above-mentioned materials as shown in FIG. 9 and FIG. 10. In addition, the sealants (not shown) attached to the fringe of the electrolyte membrane 11 are screwed on to the bend sections 23 of the connection parts 20. As a result, the connection parts 20 are fixed to the unit fuel cells.

Then, the fuel tank 40, in which the fuel pump 42, the nozzle 43, and the like are installed, is disposed at the side of the fuel electrodes 12 of the unit fuel cells 10A to 10F, and the liquid fuel 41 is supplied to the fuel tank 40. The blower 45 including the piezoelectric element 451 is installed at the side of the oxygen electrodes 13 of the unit fuel cells 10A to 10F. The fuel cell 1 is fabricated as described above. Then the up-conversion circuit 33, the secondary battery 34, and the control unit 33 are installed and electrically connected to the fuel cell 1 as shown in FIG. 1. The fuel cell system 5 shown in FIG. 1 to FIG. 4 is completed in the above-described way.

[The Behavior and Technical Merits of the Fuel Cell System]

The behavior and technical merits of the fuel cell system 5 will be described in detail.

In this fuel cell system 5, the liquid fuel 41 stored in the fuel tank 40 is sucked by the fuel pump 42, and reaches the fuel vaporizing chamber 44 after passing through the channel 423a, the check valve 425a, the pumping chamber 420, the check valve 425b, and the channel 423b in this order. In the fuel vaporizing chamber 44, the liquid fuel is ejected by the nozzle 43, and diffused widely by the diffusion section (not shown) mounted on the plate of the fuel vaporizing chamber 44. Then the liquid fuel 41 is naturally vaporized, and the vaporized fuel is supplied to the electric power generation unit 10, (that is, to the fuel electrodes of the unit fuel cells 10A to 10F to be exact).

On the other hand, air (oxygen) is supplied to the oxygen electrodes of the electric power generation unit 10 by the blower (air supply pump) 45 that includes the piezoelectric element 451. At the oxygen electrodes 13, a reaction shown in the expression (1) occurs, and hydrogen ions and electrons are produced. The hydrogen ions pass across the electrolyte membrane 11 and reach the fuel electrodes 12.

At the fuel electrodes 12, a reaction shown in the expression (2) occurs, and water and carbon dioxide are produced.

When the electric power generation unit 10 is taken as a whole, a reaction shown in the expression (3) occurs, producing an electromotive force.

$$CH_3OH + H_2O \rightarrow CO_2 + 6H^+ + 6e^- \quad (1)$$

$$6H^+ + (3/2)O_2 + 6e^- \rightarrow 3H_2O \quad (2)$$

$$CH_3OH + (3/2)O_2 \rightarrow CO_2 + 2H_2O \quad (3)$$

In this way, part of the chemical energy of the liquid fuel 41, that is, methanol, is converted into electrical energy. After passing through the connection parts 20, the electrical energy is removed from the electric power generation unit 10 in the form of electric current (as a generated current I1 shown in FIG. 1). The generated voltage (DC voltage) V1 based on the generated current I1 is up-converted by the up-conversion circuit 33 into a DC voltage V2. This DC voltage V2 is supplied to the secondary battery 34 or a load (for example, an electronics apparatus to which the fuel cell 1 belongs). If the DC voltage V2 is supplied to the secondary battery 34, the secondary battery 34 stores this electric energy on the basis of this DC voltage V2. On the other hand, if the DC voltage V2 is supplied to the load 6 through the output terminals T2 and T3, the load 6 is driven by the DC voltage V2 to perform the predefined movements.

As for the behavior of the fuel pump 42, the supply of the liquid fuel is adjusted in accordance with the amount of the fuel supplied at one switching action of the pump 42, the cycle $\Delta t$ of the fuel supply, and the vibration frequency f of the piezoelectric element 422 of the fuel pump 42, where the amount of the fuel supplied at one switching action of the pump 42, the cycle $\Delta t$ of the fuel supply, and the vibration frequency f of the piezoelectric element 422 are controlled by the control unit 35.

As for the behavior of the blower 45, the supply of the air (oxygen) is also adjusted in accordance with the vibration frequency f of the piezoelectric element 451 that is controlled by the control unit 35.

Figure 11:
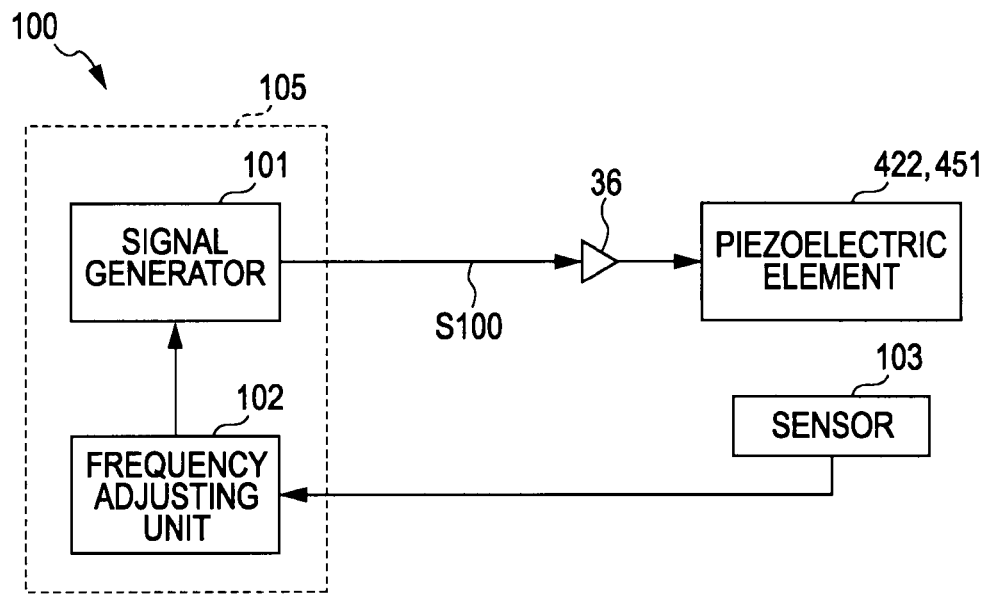
FIG. 11 is a block diagram showing a schematic configuration of a piezoelectric vibration device system cited as a comparative example.

In an existing piezoelectric vibration device system 100 shown as a comparative example in FIG. 11, the vibration frequencies of piezoelectric elements 422 and 451 are controlled as follows. This piezoelectric vibration device system 100 includes a control unit 105 having a signal generator 101 and a frequency adjusting unit 102 instead of the control unit 35 of the embodiment of the present invention shown in FIG. 7. In addition, different from the fuel cell system 5 according to the embodiment of the present invention, the piezoelectric vibration device system 100 includes a sensor 103 in the vicinity of the piezoelectric elements 422 and 451. The sensor is used for feedback control executed in order to optimize the resonance conditions for the piezoelectric elements 422 and 451.

Figure 12:
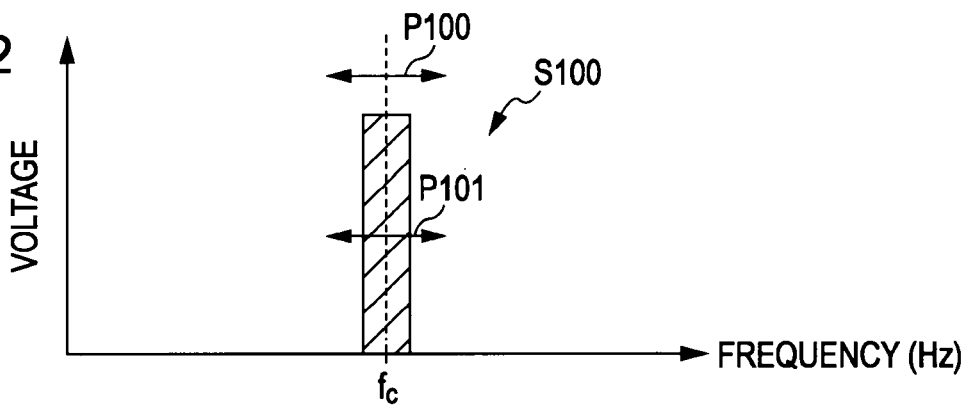
FIG. 12 is a graph showing a frequency characteristic of a control signal of the piezoelectric vibration device system cited as the comparative example.

In this comparative vibration device system 100, as shown in FIG. 12, if the resonance frequency fc unique to the piezoelectric elements 422 and 451 changes depending on the environmental changes (Refer to the arrow P100 in FIG. 12), a control signal S100 is generated as follows. In order that the frequency of the control signal S100 is matched with the resonance frequency fc with pinpoint precision even if the resonance frequency fc varies, the frequency of control signal S100 has to be adjusted with the use of feedback control (Refer to P101 in FIG. 12). In order to execute the feedback control for adjusting the frequency of control signal S100, the above-mentioned sensor 103 or a resonance circuit (not shown) has to be installed, which results in cost increases.

Compared with the existing piezoelectric vibration device system 100, the control signals S1 and S2 are generated and used to control the piezoelectric elements 422 and 451 in the fuel cell system 5 according to the embodiment of the present invention, for example, as shown in FIG. 7. Firstly, the signal generator 351 generates a fundamental frequency signal Sa having a fundamental frequency fa that exists around the mechanical resonance frequency fc of the piezoelectric elements 422 and 451, while the signal generator 352 generates a variable frequency signal Sb having a frequency fb that varies periodically. Then the frequency modulator 353 executes frequency modulation with the use of the fundamental frequency signal Sa and the variable frequency signal Sb.

Figure 13:
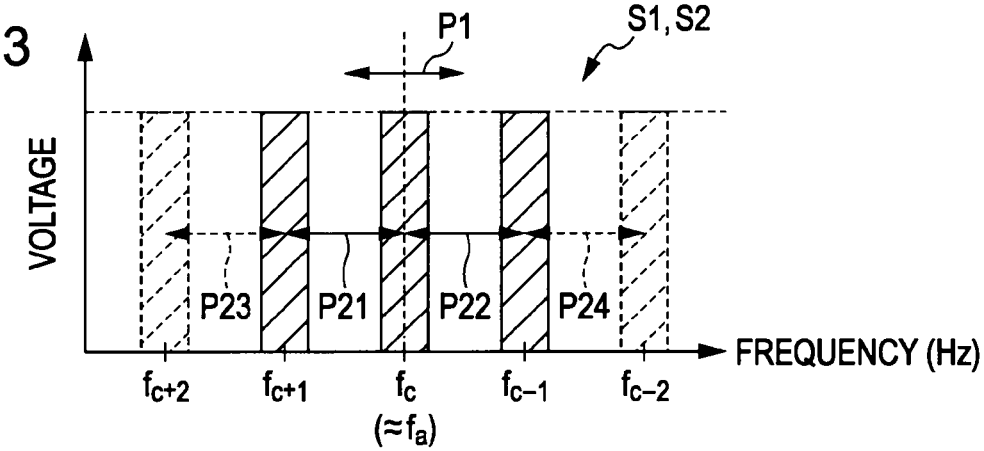
FIG. 13 is a graph showing a frequency characteristic of a control signal of the piezoelectric vibration device system according to the embodiment of the present invention.

As a result of executing the frequency modulation, a frequency modulated signal, whose frequency changes into one of three or more frequencies ($f_{c+1}$, $f_{c-1}$, $f_{c+2}$, $f_{c-2}$, etc.) existing around the fundamental frequency fa (≅fc) periodically and in sequence, for example, as shown by arrows P21 to P24 in FIG. 13, is generated as the control signal S1 or S2. Therefore, the sensor 103 for the feedback used in the existing piezoelectric vibration device system 100 is not necessary in the fuel cell system 5 according to the embodiment of the present invention, and it also becomes unnecessary to exactly match the frequencies of the control signal S1 and S2 to the mechanical resonance frequency fc of the piezoelectric elements 422 and 451 that changes depending on the environmental changes. As a result, the control of the frequency of the piezoelectric elements 422 and 451 comparable with the control in the related art can be realized with a simpler configuration.

Figure 15:
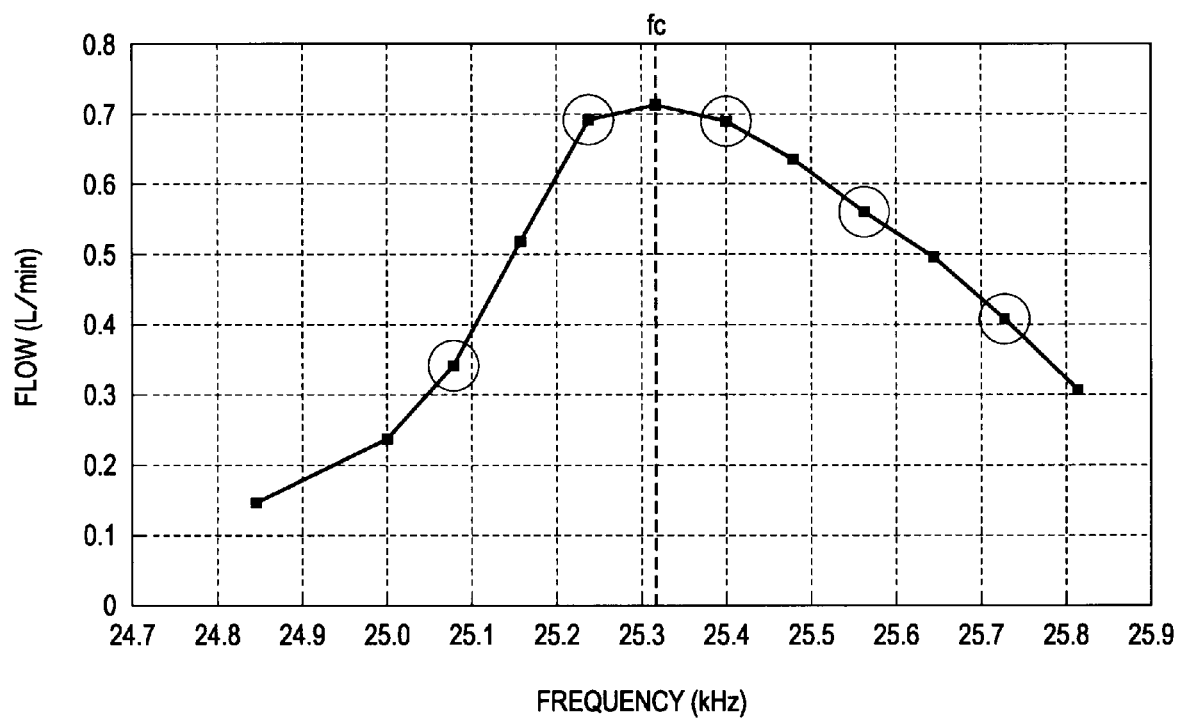
FIG. 15 is a graph showing an example of the relationship between the frequency of the control signal and the flow of fuel supplied from the fuel pump according to the embodiment of the present invention.

In the above-described existing control method where only a single control signal is output at one control step using a single demultiplying ratio, only seven control signals with different frequencies can be used, for example, between the frequency range from 24.8 kHz to 25.8 kHz as shown in FIG. 14. On the other hand, because the control signal S1 or S2 according to the embodiment of the present invention changes its frequency into plural frequencies at one control step using plural demultiplying ratios, for example, as shown in FIG. 15, the interpolation to calculate the frequency value between any two frequencies can be performed (Refer to the points showing interpolated values within circle marks), with the result that the frequencies of the control signal S1 and S2 can be put nearer to the resonance frequency of the piezoelectric elements.

As described above, in the embodiment of the present invention, frequency modulated signals, whose frequencies change into one of three or more frequencies periodically and in sequence, are generated through executing frequency modulation with the use of the fundamental frequency signal Sa and the variable frequency signal Sb, where the three or more frequencies exist around the fundamental frequency fa and the frequency modulated signals are used as the control signals S1 and S2 for controlling the piezoelectric elements 422 and 451. Therefore, the control of the frequency of the piezoelectric elements 422 and 451 comparable with the control in the related art can be realized with a simpler configuration in the embodiment of the present invention.

As a result, a piezoelectric vibration device system, which can be miniaturized and simplified while having the same control capability over a piezoelectric vibration device with a piezoelectric element as an existing vibration device system has, can be realized in the embodiment of the present invention. In addition, control signals with amplified frequency characteristics can be obtained without using resonance circuits. Therefore, large parts to constitute a resonance circuit—such as a capacitor and an inductor—become unnecessary, which helps miniaturizes electronics circuit block for the fuel cell system 5.

In addition, because the behavior of the fuel cell system according to the embodiment of the present invention is not absolutely affected by the resonance frequency fc unique to the piezoelectric elements 422 and 451, the control signal for driving the piezoelectric elements 422 and 451 can be obtained even if there are some variations in the characteristics of the piezoelectric elements 422 and 451.

In addition, even if two signal generating units (function generators) 351 and 352 have to be installed in the control unit 35 that includes, for example, a microcomputer, the physical size of the control unit 35 does not increase much. Therefore, an existing piezoelectric vibration device system has to install a large-sized processing unit with high processing speed used to compensate the variations of the characteristics of piezoelectric elements, while the fuel cell system according to the embodiment of the present invention can control the piezoelectric elements with the use of a small-sized processing unit with comparatively low processing speed.

It is preferable that the frequency variations of the frequency modulation signals (control signals S1 and S2) are set higher than the upper limit of audio frequency range (the upper limit fmax=16 kHz, for example) because audible sounds are generated if the frequency variations are below the upper limit.

<2. Modification Examples and Application Examples>

Although the present invention has been described in its preferred embodiment, it is understood that the present invention is not limited to any of the details of the above-described embodiment, and that various modifications and applications may be made as follows.

For example, although the behaviors of both the fuel pump 42 and the blower 45 are controlled by the control unit 35 in the above-described embodiment, another control method may be possible. It is thinkable that the behavior of any one of the fuel pump 42 and the blower 45 is controlled by the control unit of the embodiment of the present invention.

Although the electric power generation unit 10 includes 6 unit fuel cells connected in series in the above-described embodiment, the number of the unit fuel cells is not limited to 6. For example, the electric power generation unit 10 can include only one unit fuel cell, or can include any number of unit fuel cells more than one.

In addition, although the fuel cell system 5 includes the fuel tank 40 that stores the liquid fuel 41 in the above-described embodiment, the fuel cell system 5 can be configured so that the fuel tank 40 is removable from the fuel cell system 5.

In addition, although the fuel pump described in the above embodiment is a gas fuel supply type pump, the type of the fuel pump employed in the fuel cell system is not limited to the gas fuel supply type. For example, the present invention can be applicable to the fuel cell system that employs a fuel circulation method for generating electric power.

Although the fuel cell system that employs direct methanol fuel cells has been described in the above-described embodiment of the present invention, it is also understood that the present invention can be applied to other types of fuel cell systems.

In addition, although the fuel cell system has been described as an example of piezoelectric vibration device system in the above-mentioned embodiment of the present invention, it is further understood that the present invention can be applied to other types of piezoelectric vibration device systems. Among other types of piezoelectric vibration device systems are, for example, a system including a device that forcibly supplies and exhausts air for cooling, and a system including a device that cools heat generating sections in the system by circulating a liquid.

The piezoelectric vibration device system (the fuel cell system, for example) according to the embodiment of the present invention can be suitably applied to, for example, cellular phones, digital cameras, electronic notebooks, or PDAs (personal digital assistances).

The present application contains subject matter related to that disclosed in Japanese Priority Patent Application JP 2009-007367 filed in the Japan Patent Office on Jan. 16, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A piezoelectric vibration device system comprising:
a piezoelectric vibration device that includes a piezoelectric element and that performs predefined movements using vibration of the piezoelectric element; and
a control unit that controls a behavior of the piezoelectric vibration device by controlling a vibration frequency of the piezoelectric element, wherein the control unit includes:
  a first signal generating unit that generates a fundamental frequency signal having a fundamental frequency adjacent to a mechanical resonance frequency of the piezoelectric element;
  a second signal generating unit that generates a variable frequency signal having a frequency that periodically rises or falls according to a timing waveform having three discrete voltage steps along a time axis, each of the three discrete voltage steps having different voltage values; and
  a frequency modulator that generates a frequency modulated signal having a frequency that changes among one of three frequencies existing around the fundamental frequency periodically and in sequence, the frequency modulator generating the frequency modulated signal by frequency-modulating the fundamental frequency signal with the variable frequency signal, the frequency modulator outputting the frequency modulated signal as a control signal for controlling the piezoelectric vibration device.

2. The piezoelectric vibration device system according to claim 1, wherein the three discrete voltage steps are in a leading edge of the timing waveform along the time axis.

3. The piezoelectric vibration device system according to claim 2, wherein the timing waveform of the variable frequency signal approximates a triangular waveform.

4. The piezoelectric vibration device system according to claim 1, wherein a range of frequency variation of the frequency modulated signal is set higher than an uppermost audible frequency.

5. The piezoelectric vibration device system according to any of claim 1 to claim 4, further comprising:
an electric power generation unit that generates electric power with the use of fuel and oxidizing gas, wherein the piezoelectric vibration device is a piezoelectric pump unit that supplies at least one of the fuel and the oxidizing gas to the electric power generation unit.

6. The piezoelectric vibration device system according to claim 3, wherein the timing waveform of the variable frequency signal approximates a triangular waveform having a trailing side steeper than a leading side.

7. An electronics apparatus comprising:
a piezoelectric vibration device system including:
  a piezoelectric element;
  a piezoelectric vibration device that performs predefined movements using vibrations of the piezoelectric element; and
  a control unit that controls behavior of the piezoelectric vibration device by controlling a vibration frequency of the piezoelectric element, wherein the control unit includes:
    a first signal generating unit that generates a fundamental frequency signal having a fundamental frequency adjacent to a mechanical resonance frequency of the piezoelectric element;
    a second signal generating unit that generates a variable frequency signal having a frequency that periodically rises or falls according to a timing waveform having three discrete voltage steps along a time axis, each of the three discrete voltage steps having different voltage values; and
    a frequency modulator that generates a frequency modulated signal having a frequency that changes among one of three frequencies existing around the fundamental frequency periodically and in sequence, the frequency modulator generating the frequency modulated signal by frequency-modulating the fundamental frequency signal with the variable frequency signal, the frequency modulator outputting the frequency modulated signal as a control signal for controlling the piezoelectric vibration device.

* * * * *